United States Patent [19]
Honda et al.

[11] Patent Number: 5,515,048
[45] Date of Patent: May 7, 1996

[54] SENSOR VOLTAGE READING CIRCUIT

[75] Inventors: Satoshi Honda, Shiki; Yoshihiro Nakazawa, Asaka, both of Japan

[73] Assignee: Honda Giken Kogyo Kabushiki Kaisha, Japan

[21] Appl. No.: 122,285

[22] Filed: Sep. 17, 1993

[30] Foreign Application Priority Data

Sep. 17, 1992 [JP] Japan .................... 4-247817

[51] Int. Cl.$^6$ ................................... H03M 1/12
[52] U.S. Cl. ......................................... 341/55
[58] Field of Search .................... 341/155, 139, 341/118, 119, 120, 121; 324/76.82, 99 D

[56] References Cited

U.S. PATENT DOCUMENTS 4,722,019  1/1988  Pohl ........................................ 361/22

Primary Examiner—Brian K. Young

[57] ABSTRACT

A sensor voltage reading circuit for reading an analog sensor value is provided which can remove electromagnetic wave noise inputted to an input terminal of an A/D conversion circuit. The sensor voltage reading circuit includes a first voltage division circuit and a second voltage division circuit for dividing the output voltage of a potentiometer. An A/D conversion circuit has input terminals connected to the output terminals of the voltage division circuits and a processing unit for reading digital voltages obtained by conversion of the A/D conversion circuit. The processing unit removes from the converted voltages a noise voltage caused by radio waves which mix into the input terminals of the A/D conversion circuit. Accordingly, the reading accuracy of the output voltage of the sensor can be enhanced. In a further embodiment, the sensor voltage reading circuit can suppress power dissipation by the analog sensor to achieve miniaturization of the power source circuit.

11 Claims, 2 Drawing Sheets

SENSOR VOLTAGE READING CIRCUIT

BACKGROUND OF THE INVENTION

1. Field of the Invention

This invention relates to a sensor voltage reading circuit which is coupled to an analog sensor, and more particularly to a sensor voltage reading circuit which removes a noise voltage, caused by electric noise, superimposed at an input terminal of an analog/digital conversion circuit of the sensor voltage reading circuit. This invention also relates to a sensor voltage reading circuit wherein a voltage is applied to a power source terminal of a sensor only when the output voltage of the sensor is to be read to suppress the power dissipation by the sensor.

2. Description of Background Art

Conventionally, in a field wherein a physical amount is detected as an electric amount, a method of detecting the physical amount by means of an analog sensor is commonly employed which includes converting the output of the analog sensor into a digital value by means of an analog/digital (hereinafter referred to as A/D) conversion circuit and processing the digital value by calculation processing by means of a central processing unit (hereinafter referred to as CPU).

In this instance, a noise removal circuit is interposed between the analog sensor and the A/D conversion circuit to remove a noise voltage superimposed on the output voltage of the analog sensor.

However, a power source terminal of the analog sensor is in most cases connected in parallel with a power source terminal of a controller which is formed by the A/D conversion circuit and the CPU. Consequently, if a voltage is applied to the power source terminal of the controller, then the voltage is also applied to the power source terminal of the analog sensor. While it is possible to remove a noise voltage superimposed on the output voltage of the analog sensor, there is a disadvantage in that electromagnetic wave noise inputted from the input terminal of the A/D conversion circuit cannot be removed.

Furthermore, since a voltage is applied simultaneously to the power source terminal of the controller and the power source terminal of the analog sensor, and also since a voltage is applied even when the CPU does not read the output of the analog sensor, a voltage is always applied to the power source terminal of the analog sensor. Therefore, there is a problem in that power is dissipated by the analog sensor.

SUMMARY OF THE INVENTION

The present invention has been made to solve such problems as described above, and it is an object of the present invention to provide a sensor voltage reading circuit which can remove electromagnetic wave noise inputted to an input terminal of an A/D conversion circuit.

Another object of the present invention is to provide a sensor voltage reading circuit which can suppress power dissipation of an analog sensor and achieve miniaturization of a power source circuit.

The above noted objectives are solved in accordance with a first aspect of the present invention which embodies a sensor voltage reading circuit including a sensor for outputting an analog voltage value and a plurality of voltage division circuits having different voltage division values for dividing the analog voltage value output from the sensor. An analog/digital conversion circuit is provided for converting the divided analog voltage values into respective digital values. A discrimination means is provided for discriminating the analog voltage value in accordance with the respective digital values.

Further, a second aspect of the present invention which embodies a sensor voltage reading circuit includes a sensor for outputting an analog voltage value and sensor output reading means for reading the analog voltage value output from the sensor. A power supply means is provided for supplying operating voltage to the sensor. A voltage change-over means is provided for energizing/deenergizing supply of the operating voltage to a power source terminal of the sensor. Control means are provided for energizing the voltage change-over means to supply the operating voltage to the power source terminal of the sensor and for energizing the sensor output reading means to read the output voltage of the sensor.

In the sensor voltage reading circuit according to the present invention, the output voltage of an analog value output from the sensor is inputted to the analog/digital conversion circuit by way of the plurality of voltage division circuits having different voltage division values. Based on the individual digital values obtained via conversion by the analog/digital conversion circuit, a noise voltage removal circuit removes electromagnetic wave noises of an equal value from the analog signal inputted to the respective input terminals of the analog/digital conversion circuit. Consequently, an output voltage of the sensor can be obtained wherein the effects of electromagnetic wave noises inputted to the input terminals of the analog/digital conversion circuits have been removed.

Furthermore, in the sensor voltage reading circuit according to the present invention, the voltage change-over means energized by the control means supplies a voltage to the power source terminal of the sensor. Thereafter, the control means energizes the sensor output reading means for reading the output voltage of the sensor. Accordingly, a voltage is applied to the power source terminal of the sensor only when the output voltage of the sensor is to be read.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only and thus are not limitative of the present invention, and wherein.

DETAILED DESCRIPTION OF THE PREFERRED EMBODIMENTS

In the following, preferred embodiments of a sensor voltage reading circuit according to the present invention will be given and described in detail with reference to the accompanying drawings.

Figure 1:
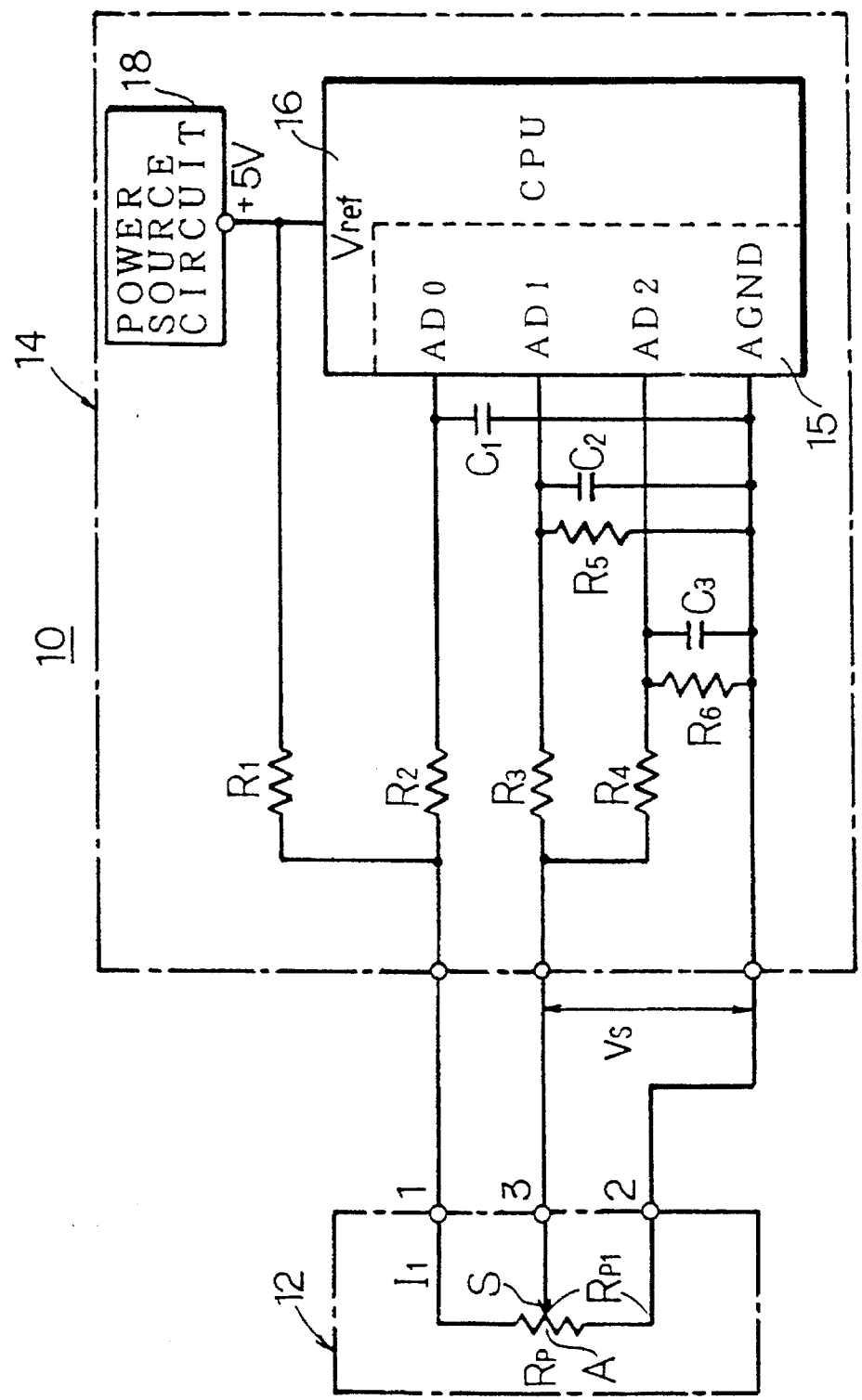
FIG. 1 is an illustration of a sensor voltage reading circuit of a first embodiment of the present invention.

FIG. 1 is a view showing a construction of a sensor voltage reading apparatus 10 of a first embodiment of the present invention.

Referring to FIG. 1, reference numeral 12 denotes a contact type potentiometer used as an analog sensor which outputs a voltage in accordance with an amount of rotation and reference numeral 14 denotes a sensor voltage reading circuit.

The potentiometer 12 includes a resistor $R_p$, a sliding element S which slidably moves on the resistor $R_p$, and a shaft (not shown) for driving the sliding element S to rotate. The potentiometer 12 further includes a terminal 1 connected to an end portion of the resistor $R_p$, another terminal 2 connected to the other end portion of the resistor $R_p$, and a further terminal 3 connected to the sliding element S.

The sensor voltage reading circuit 14 includes a CPU 16 provided with an A/D conversion circuit 15 and a power source circuit 18 for supplying dc power as power to terminal Vref of the CPU 16 and for supplying dc power to the terminal 1 of the potentiometer 12 by way of a resistor $R_1$.

The terminal 1 of the potentiometer 12 is connected to a terminal of a resistor $R_2$ and the other terminal of the resistor $R_2$ is connected to an input terminal AD0 of the A/D conversion circuit 15 and also connected to a terminal of a capacitor $C_1$, which absorbs noise superimposed on the power. The other terminal of the capacitor $C_1$ is connected to an analog ground (hereinafter referred to as AGND) terminal of the A/D conversion circuit 15 and the terminal 2 of the potentiometer 12 is connected to the AGND terminal of the A/D conversion circuit 15.

The terminal 3 of the potentiometer 12 is connected to a terminal of a resistor $R_3$ a terminal of another resistor $R_4$. The other terminal of the resistor $R_3$ is connected to a first input terminal AD1 of the A/D conversion circuit 15, a terminal of a resistor $R_5$ and a terminal of a capacitor $C_2$. The other terminal of the resistor $R_5$ and the other terminal of the capacitor $C_2$ are connected to the AGND terminal of the A/D conversion circuit 15.

Accordingly, the voltage between the terminal 2 and the terminal 3 of the potentiometer 12 serves as an output voltage $V_s$ of the potentiometer 12.

In this instance, the resistor $R_3$ and the resistor $R_5$ form a first voltage division circuit for dividing the output voltage $V_s$ of the potentiometer 12. The resistor $R_3$ and the capacitor $C_2$ form a first low-pass filter LPF for passing a low frequency region of the output voltage $V_s$ of the potentiometer 12.

The other terminal of the resistor $R_4$ is connected to a second input terminal AD2 of the A/D conversion circuit 15 and also to a terminal of a resistor $R_6$ and a terminal of a capacitor $C_3$. The other terminal of the resistor $R_6$ and the other terminal of the capacitor $C_3$ are connected to the AGND terminal of the A/D conversion circuit 15.

The resistor $R_4$ and the resistor $R_6$ form a second voltage division circuit for dividing the output voltage $V_s$ of the potentiometer 12. The resistor $R_4$ and the capacitor $C_3$ form a second low-pass filter LPF for passing a low frequency region of the output voltage $V_s$ of the potentiometer 12.

The operation of the sensor voltage reading circuit 14 constructed in such a manner as described above when output voltage $V_s$ of the potentiometer 12 is read and a noise voltage caused by radio waves and mixed in from the input terminal AD1 and the input terminal AD2 of the A/D conversion terminal 15 is removed will be described in detail below.

A voltage is applied from the power source circuit 18 by way of the resistor $R_1$ to the terminal 1 of the potentiometer 12, and then, the shaft of the potentiometer 12 is driven externally to rotate to displace the sliding element S. When the sliding element S is stopped at a point A at which, for example, a resistance value $R_{P1}$ is provided between the terminal 2 and the terminal 3, the output voltage $V_s$ at the terminal 3 is given by the following equation:

$$V_s = I_1 \times R_{P1} \tag{1}$$

In the equation (1) above, $I_1$ represents a current flowing through the potentiometer 12. The output voltage $V_s$ is inputted to the first input terminal AD1 of the A/D conversion circuit 15 by way of the first voltage division circuit formed by the resistor $R_3$ and the resistor $R_5$ and the first low-pass filter LPF and is inputted to the second input terminal AD2 of the A/D conversion circuit 15 by way of the second voltage division circuit formed by the resistor $R_4$ and the resistor $R_6$ and the second low-pass filter LPF.

Accordingly, the input voltage $V_{AD1}$ to be inputted to the input terminal AD1 is given by an equation (2) and the input voltage $V_{AD2}$ to be inputted to the input terminal AD2 is given by an equation (3):

$$V_{AD1} = \{R_5/R_3 + R_5\} \times V_s \tag{2}$$

$$V_{AD2} = \{R_6/(R_4 + R_6)\} \times V_s \tag{3}$$

Meanwhile, a noise voltage superimposed on the output voltage $V_s$ of the potentiometer 12 is cut off individually by the first low-pass filter LPF and the second low-pass filter LPF.

In this instance, if radio waves are mixed into the input terminal AD1 and the input terminal AD2 and an equal noise voltage $V_n$ is produced between the AGND terminal and the input terminal AD1 and between the AGND terminal and the input terminal AD2 by the radio waves, then the input voltage $V_{AD1}$ at the input terminal AD1 given by the equation (2) above is given by an equation (4), and the input voltage $V_{AD2}$ at the input terminal AD2 given by the equation (3) above is given by an equation (5):

$$V_{AD1} = \{R_5/(R_3 + R_5)\} \times V_s + V_n \tag{4}$$

$$V_{AD2} = \{R_6/(R_4 + R_6)\} \times V_s + V_n \tag{5}$$

The input voltage $V_{AD1}$ of an analog value obtained from the equation (4) above and the input voltage $V_{AD2}$ of an analog value obtained from the equation (5) above are individually converted into digital values by the A/D conversion circuit 15, and the digital values are read by the CPU 16. The CPU 16 executes calculation for removing the noise voltage $V_n$ caused by the radio waves based on the individually read digital values.

In particular, the CPU 16 executes a calculation to find out a difference between the equation (4) and the equation (5), $$V_{AD1} - V_{AD2} = [\{R_5/(R_3 + R_5)\} \times V_s + V_n] - [\{R_6/(R_4 + R_6)\} \times V_s + V_n] \tag{6}$$

$$V_{AD1} - V_{AD2} = \{R_5/(R_3 + R_5) - R_6/(R_4 + R_6)\} \times V_s \tag{7}$$

and the output voltage $V_s$ of the potentiometer 12 is calculated from the equation (7) above.

$$V_s = (V_{AD1} - V_{AD2})/\{R_5/(R_3 + R_5) - R_6/(R_4 + R_6)\} \tag{8}$$

By the calculations described above, the output voltage $V_s$ at the displaced point A, to which the sliding element S of the potentiometer 12 has been displaced can be obtained. The effects of the equal noise voltage $V_n$ mixed into the input terminal AD1 and the input terminal AD2 is removed.

Figure 2:
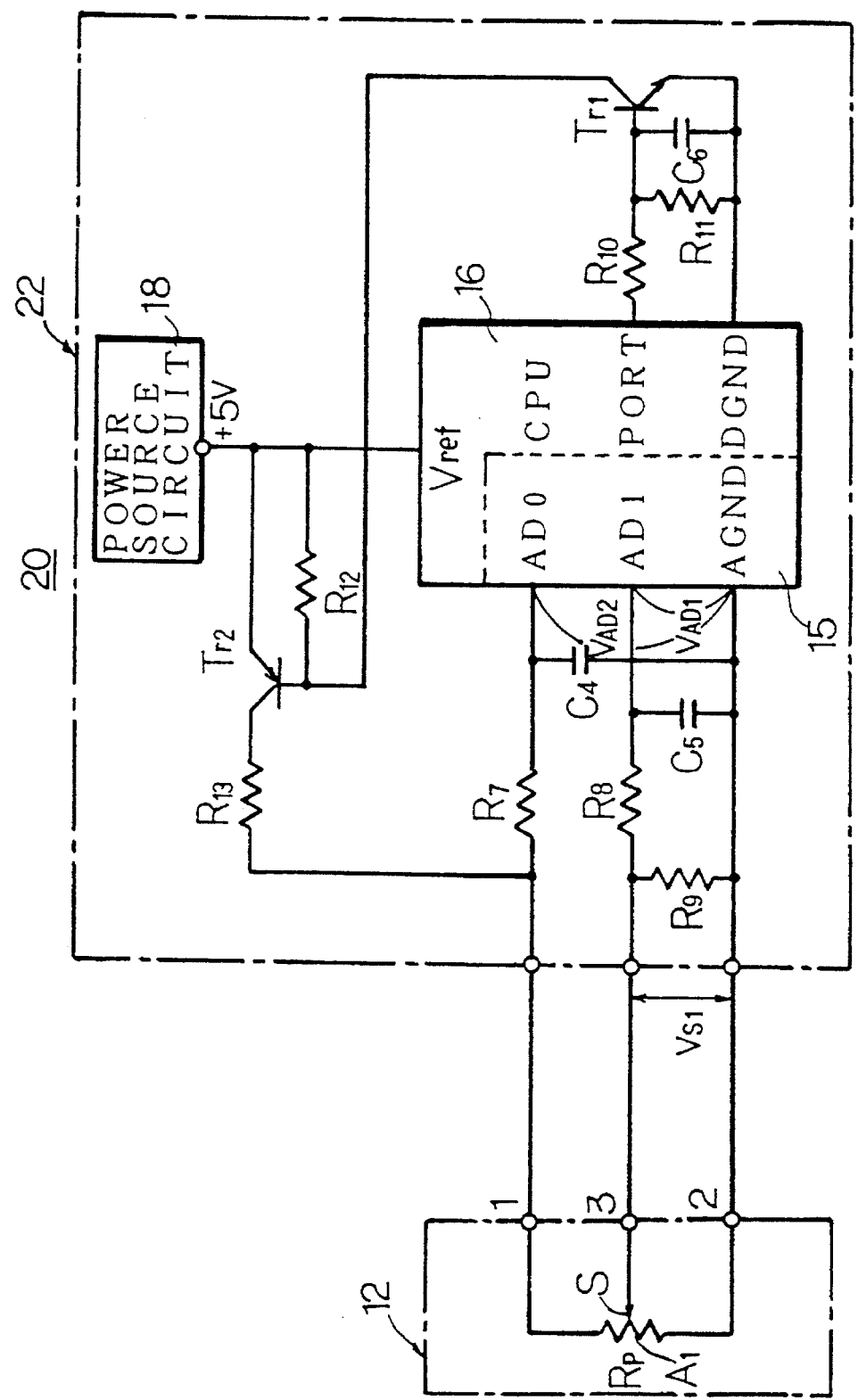
FIG. 2 is an illustration of a sensor voltage reading circuit of a second embodiment of the present invention.

A second aspect of the present invention embodying a sensor voltage reading apparatus 20 which suppresses power dissipation of an analog sensor will be described with reference to FIG. 2.

It is to be noted that same components as those of FIG. 1 are denoted by the same reference characters and detailed description thereof is omitted.

A terminal 1 of a potentiometer 12 is connected to an input terminal AD0 of an A/D conversion circuit 15 by way of a resistor $R_7$ of a sensor voltage reading circuit 22 and another terminal 2 of the potentiometer 12 is connected to an AGND terminal of the A/D conversion circuit 15. A further terminal 3 of the potentiometer 12 is connected to an input terminal AD1 of the A/D conversion circuit 15 by way of a resistor $R_8$.

A capacitor $C_4$ for absorbing noise is connected between the input terminal AD0 and the AGND terminal of the A/D conversion circuit 15 and another capacitor $C_5$ is connected between the input terminal AD1 and the AGND terminal of the A/D conversion circuit 15. The resistor $R_8$ and the capacitor $C_5$ from a first low-pass filter LPF. Further, a resistor $R_9$ is connected between the terminal 3 and the terminal 2 of the potentiometer 12.

Meanwhile, an output port PORT of the CPU 16 is connected to the base terminal of an NPN-type transistor $T_{r1}$ by way of a resistor $R_{10}$ and a digital ground (hereinafter referred to as DGND) terminal of the CPU 16 and the emitter terminal of the transistor $T_{r1}$ are connected to each other. In this instance, the AGND terminal and the DGND terminal of the A/D conversion circuit 15 are connected to each other within the A/D conversion circuit 15. A resistor $R_{11}$ and a capacitor $C_6$ are connected in parallel between the base terminal and the emitter terminal of the transistor $T_{r1}$.

The collector terminal of the transistor $T_{r1}$ is connected to the base terminal of a PNP-type transistor $T_{r2}$ as another switching terminal and the emitter terminal of the transistor $T_{r2}$ is connected to the output terminal of a power source circuit 18. A bias resistor $R_{12}$ is connected between the base terminal of the transistor $T_{r2}$ and the emitter terminal of the transistor $T_{r2}$. The collector terminal of the transistor $T_{r2}$ and the terminal 1 of the potentiometer 12 are connected to each other by way of a resistor $R_{13}$.

The operation of reading the output voltage $V_{s1}$ of the potentiometer 12 by means of the sensor voltage reading circuit 22 constructed in such a manner as described above will be described.

If a signal of an "H" level is output from the output terminal PORT of the CPU 16, then the collector and emitter of the transistor $T_{r1}$ as the switching element are switched to an "ON" state. Consequently, the emitter and collector of the transistor $T_{r2}$ are switched to an "ON" state so that a voltage is applied to the terminal 1 of the potentiometer 12.

Thus, the A/D conversion circuit 15 energized by the CPU 16 converts the voltage $V_{AD1}$ inputted to the input terminal AD1 of the A/D conversion circuit 15 into a digital value and the digital value is read by the CPU 16. In this instance, by selecting the values of the resistor $R_8$ and the resistor $R_9$ so as to satisfy the relationship $R_8 \gg R_9$, $V_{s1}=V_{AD1}$ is satisfied.

The output voltage $V_{s1}$ at a displaced position $A_1$ of the sliding element S of the potentiometer 12, which has been displaced by driving rotation of the shaft, is read in this manner.

In this instance, the CPU 16 reads the voltage $V_{AD0}$ inputted to the input terminal AD0 and calculates a percentage of the displaced point $A_1$ of the sliding element S from the value of the voltage $V_{AD0}$ and the output voltage $V_{s1}$ of the potentiometer 12, that is, the voltage $V_{AD1}$ inputted to the input terminal AD1, in accordance with the following equation:

$$A_1=(V_{AD1}/V_{AD0})\times 100\ (\%) \qquad (9)$$

In this manner, according to the present embodiment, the CPU 16 reads the output voltage $V_{s1}$ of the potentiometer 12 after the CPU 16 outputs through the output port PORT a signal which results in application of a voltage to the terminal 1 of the potentiometer 12. When CPU 16 does not read the output voltage $V_{s1}$ of the potentiometer 12, a voltage is not applied to the terminal 1 of the potentiometer 12 and accordingly, the electric energy dissipated by the potentiometer 12 can be suppressed.

With the sensor voltage reading circuit according to the present invention, an output voltage of the sensor can be obtained from which electric noises mixed at the input terminals of the analog/digital conversion circuit have been removed. The reading accuracy of the output voltage of the sensor can therefore be enhanced.

Further, since a voltage is applied to the power source terminal of the sensor only when the output voltage of the sensor is to be read and since no voltage is applied to the power source terminal of the sensor when the output of the sensor is not to be read, suppression of the power dissipated by the sensor is realized. It is therefore possible to achieve miniaturization of the power source circuit. Accordingly, heat generation of the power source circuit can be suppressed and cooling of the entire apparatus in which the power source circuit is accommodated is facilitated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sensor voltage reading apparatus comprising:

sensor means for outputting an analog voltage value;

a plurality of voltage division means, having different voltage division values, for each dividing the analog voltage value;

analog/digital conversion means for separately converting each of the divided analog voltage values into respective digital values, the analog voltage values being input to said analog/digital conversion means via respective input terminals; and discrimination means, coupled to said analog/digital conversion means, for discriminating the analog voltage value in accordance with the respective digital values.

2. The sensor voltage reading apparatus of claim 1, wherein said discrimination means comprises noise removal means for removing from the respective digital values electrical noises of an equal value input the respective input terminals of said analog/digital conversion means.

3. The sensor voltage reading apparatus of claim 1, further comprising a plurality of low-pass filters, respectively coupled to said plurality of voltage division means, for passing low frequency components of the divided analog voltage values.

4. The sensor voltage reading apparatus of claim 1, wherein said sensor means comprises a potentiometer.

5. A method of reading an output analog voltage value of a sensor using a sensor reading apparatus including a plurality of voltage division means, analog/digital conversion means and discrimination means, the method of reading comprising the steps of:

dividing the output analog voltage value of the sensor in the plurality of voltage division means to output a corresponding plurality of divided analog voltage values;

separately converting each of the divided analog voltage values in the analog/digital conversion means into respective digital values; and discriminating the output analog voltage value in the discrimination means in accordance with the respective digital values.

6. A sensor voltage reading apparatus comprising:

a plurality of voltage division means, coupled to an externally provided analog sensor voltage, for each dividing the analog sensor voltage;

a plurality of analog/digital conversion means, each coupled to a respective one of said plurality of voltage division means via respective input terminals, for converting the divided analog sensor voltage output from the respective one of said plurality of voltage division means to provide respective digital sensor voltages; and noise removal means, coupled to said plurality of analog/digital conversion means, for discriminating and removing noise mixed into the input terminals of said plurality of analog/digital conversion means, in accordance with the respective digital sensor voltages, to provide the analog sensor voltage.

7. The sensor voltage reading apparatus of claim 6, wherein said plurality of voltage division means divide the analog sensor voltage using respective different voltage division values.

8. The sensor voltage reading apparatus of claim 6, wherein the analog sensor voltage is an externally provided potentiometer output.

9. A method of reading a sensor voltage comprising the steps of:

a) dividing an externally provided analog sensor voltage to provide a plurality of divided analog sensor voltages;

b) respectively converting each of the plurality of divided analog sensor voltages to provide respective digital sensor voltages; and c) discriminating and removing noise mixed into the plurality of divided analog sensor voltages prior to said step b), based on the respective digital sensor voltages, to provide the analog sensor voltage.

10. The method of reading a sensor voltage of claim 9, wherein said step a) comprises dividing the analog sensor voltage using a plurality of different respective voltage division values.

11. The method of reading a sensor voltage of claim 9, wherein the analog sensor voltage is an externally provided potentiometer output.

* * * * *